(12) United States Patent
Shinma et al.

(10) Patent No.: US 6,515,347 B1
(45) Date of Patent: Feb. 4, 2003

(54) WAFER LEVEL SEMICONDUCTOR DEVICE AND METHOD OF MANUFACTURING THE SAME

(75) Inventors: Yasuhiro Shinma, Isehara (JP); Norio Fukasawa, Kawasaki (JP); Takashi Hozumi, Kawasaki (JP); Toshimi Kawashara, Kawasaki (JP); Masamitsu Ikumo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/588,348

(22) Filed: Jun. 7, 2000

(30) Foreign Application Priority Data

Jan. 11, 2000 (JP) ........................................ 2000-002943

(51) Int. Cl.$^7$ ........................................... H01L 23/544
(52) U.S. Cl. ..................... 257/620; 257/700; 257/707; 257/747
(58) Field of Search ................................ 257/702, 708, 257/707, 620, 747

(56) References Cited

U.S. PATENT DOCUMENTS

| | | | | |
|---|---|---|---|---|
| 5,008,213 A | * | 4/1991 | Kolesar, Jr. .................. | 437/51 |
| 5,024,970 A | * | 6/1991 | Mori ............................ | 437/226 |
| 5,903,044 A | * | 5/1999 | Farnworth et al. ........... | 257/620 |
| 5,903,051 A | * | 5/1999 | Miks ............................ | 257/700 |
| 5,907,785 A | * | 5/1999 | Palagonia .................... | 438/613 |
| 5,969,427 A | * | 10/1999 | Wensel ........................ | 257/787 |
| 6,130,111 A | * | 10/2000 | Ikuina ......................... | 438/106 |
| 6,225,205 B1 | * | 5/2001 | Kinoshita .................... | 438/613 |
| 6,326,683 B1 | * | 12/2001 | Houdeau et al. ............. | 257/668 |
| 6,331,449 B1 | * | 12/2001 | Ohsumi ....................... | 438/113 |

FOREIGN PATENT DOCUMENTS

JP         405021629 A  *  1/1993

* cited by examiner

*Primary Examiner*—Olik Chaudhuri
*Assistant Examiner*—Nathan W. Ha
(74) *Attorney, Agent, or Firm*—Armstrong, Westerman & Hattori, LLP

(57) ABSTRACT

A wafer level semiconductor device including a wafer having a plurality of semiconductor elements formed on an upper surface thereof, a sealing resin including a first part for sealing the upper surface of the wafer and a second part for sealing a side surface of wafer, the second part having a lower edge surface flush with a lower surface of the wafer, and a film for covering the lower surface of wafer and the lower edge surface of the second part of the sealing resin and conducting the process using the wafer level semiconductor device in which the film is bonded. This structure prevents warping of the wafer level semiconductor device after the sealing resin is formed on the device and it is then taken out from the mold dies.

11 Claims, 12 Drawing Sheets

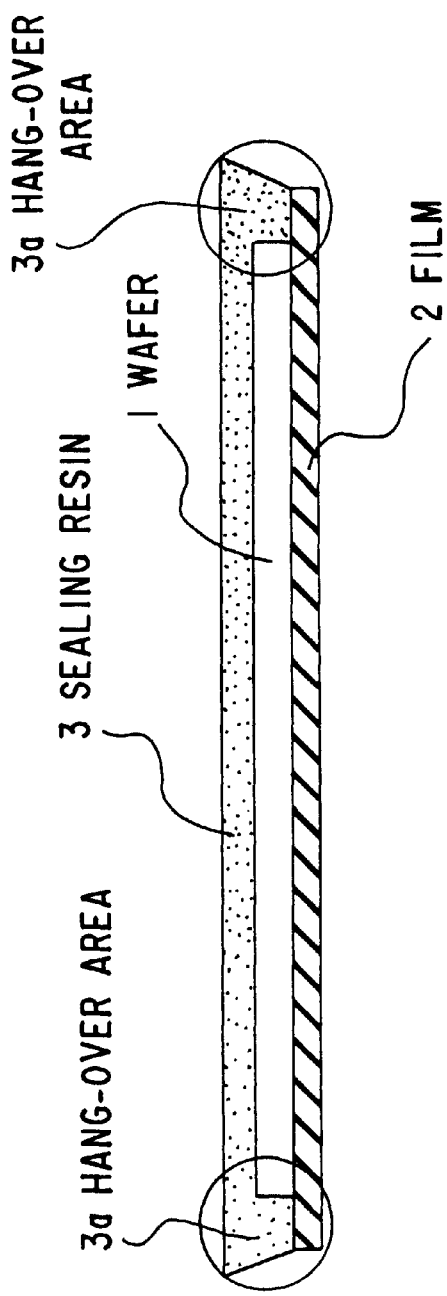
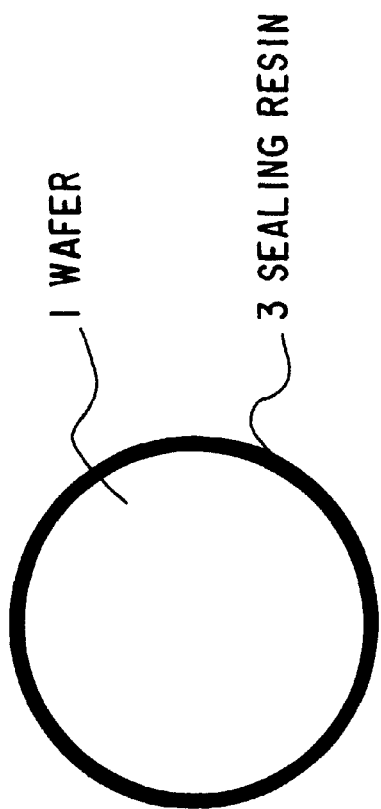
FIG.1(a)
FIG.1(b)

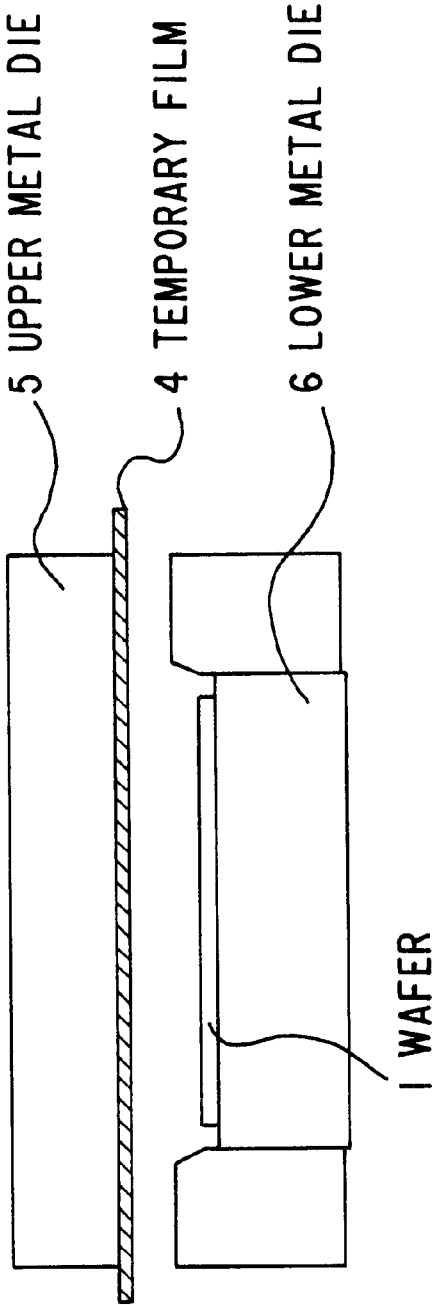
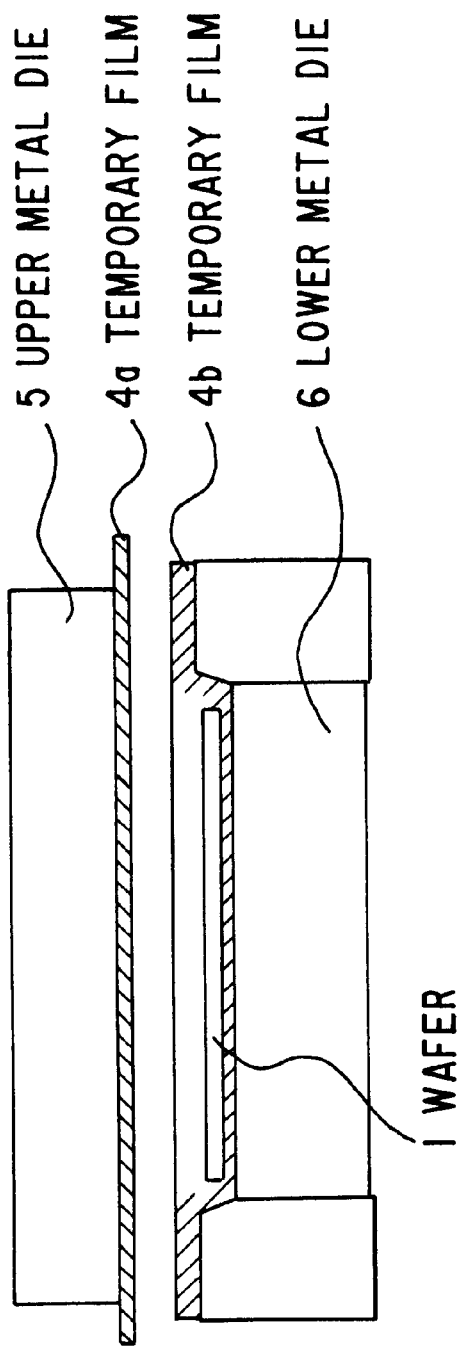
FIG.2(a)
FIG.2(b)

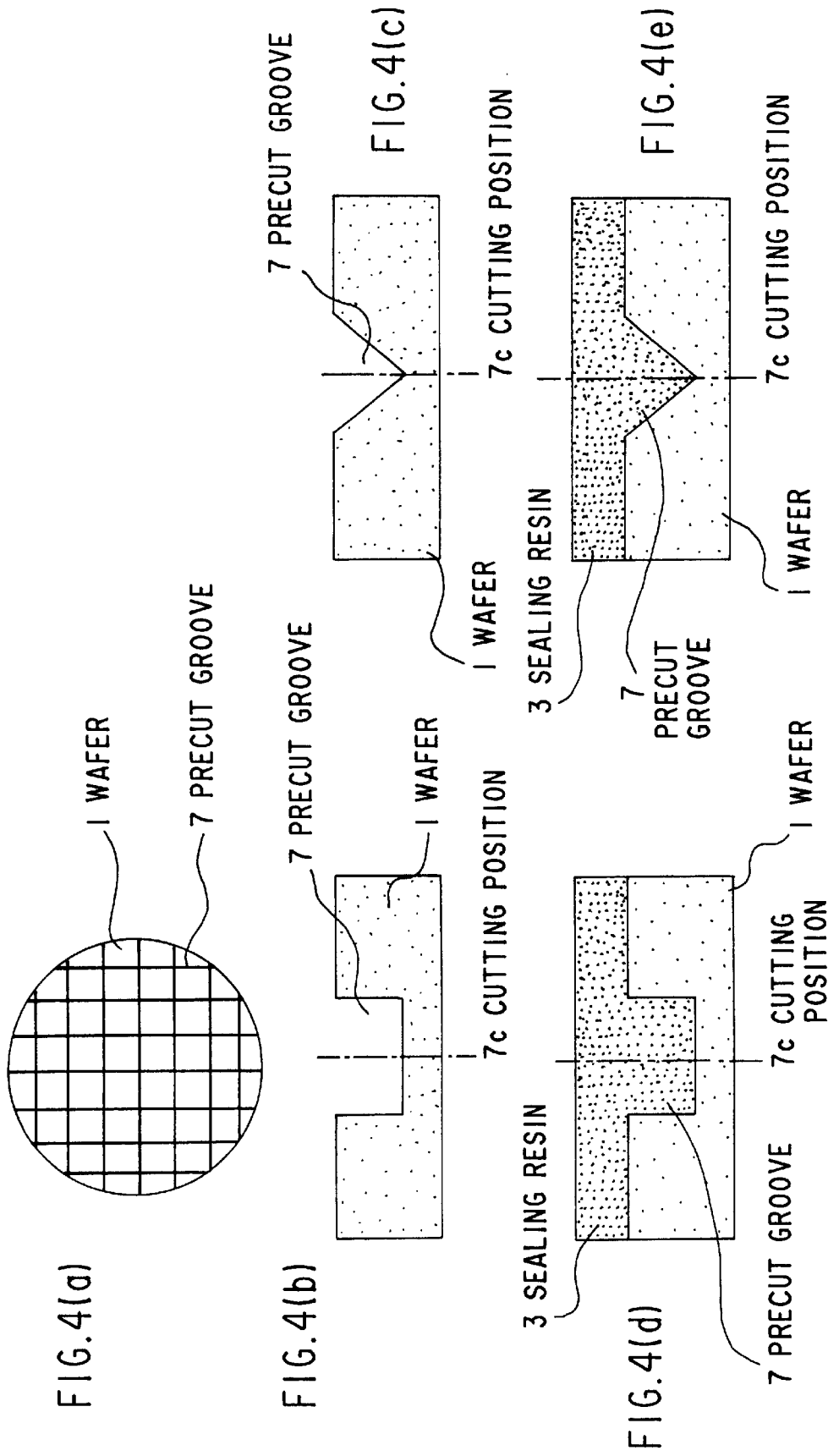

3 SEALING RESIN

3a HANG-OVER AREA

1 WAFER

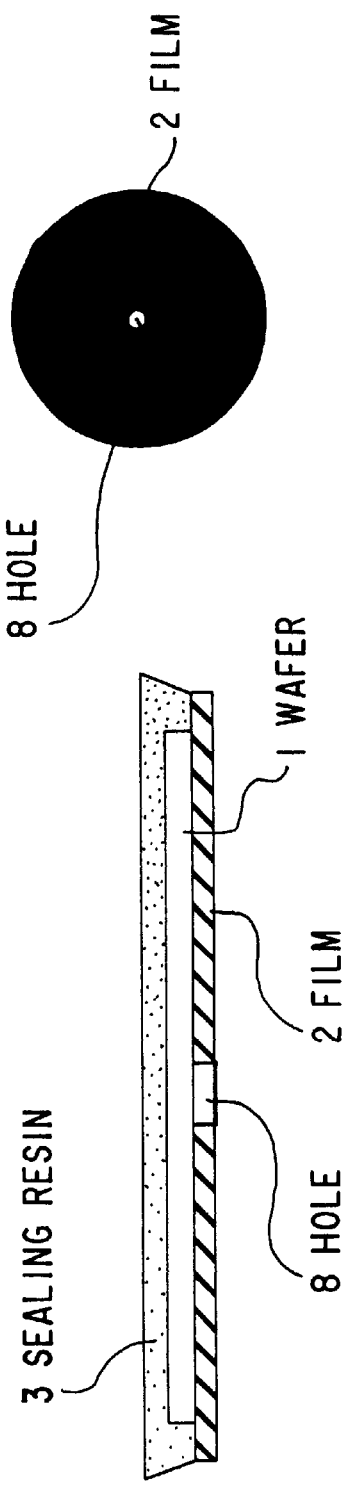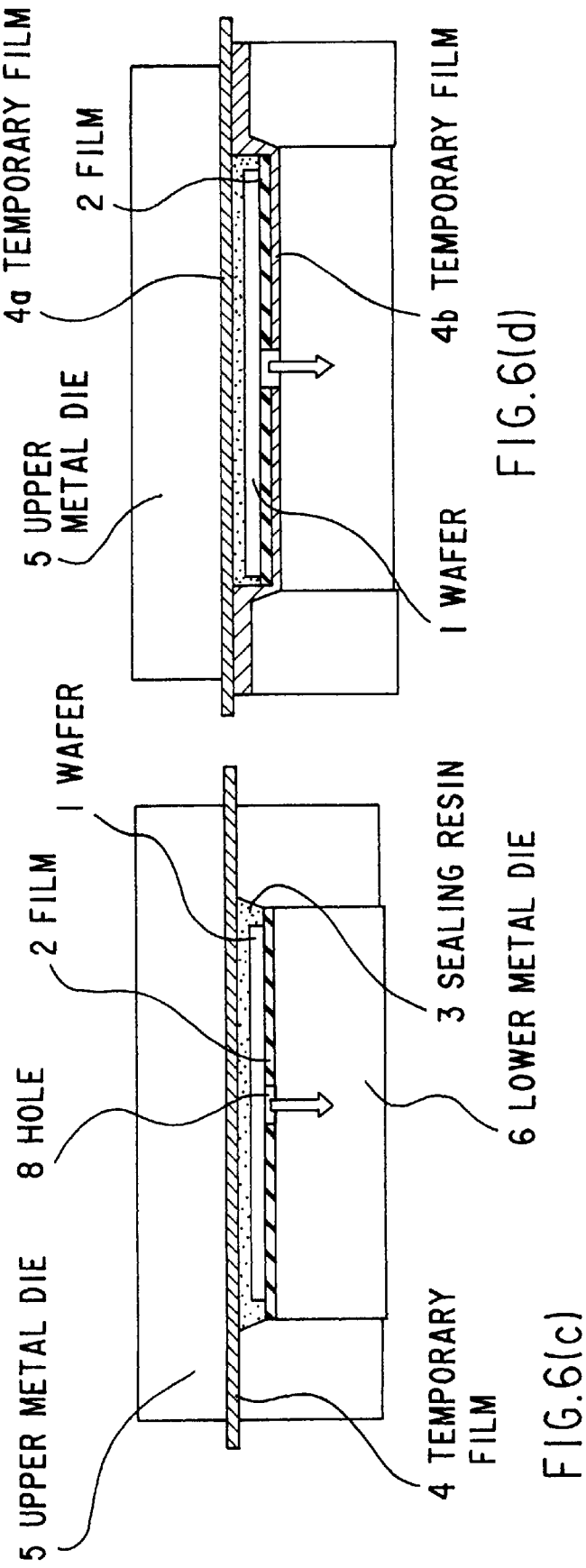

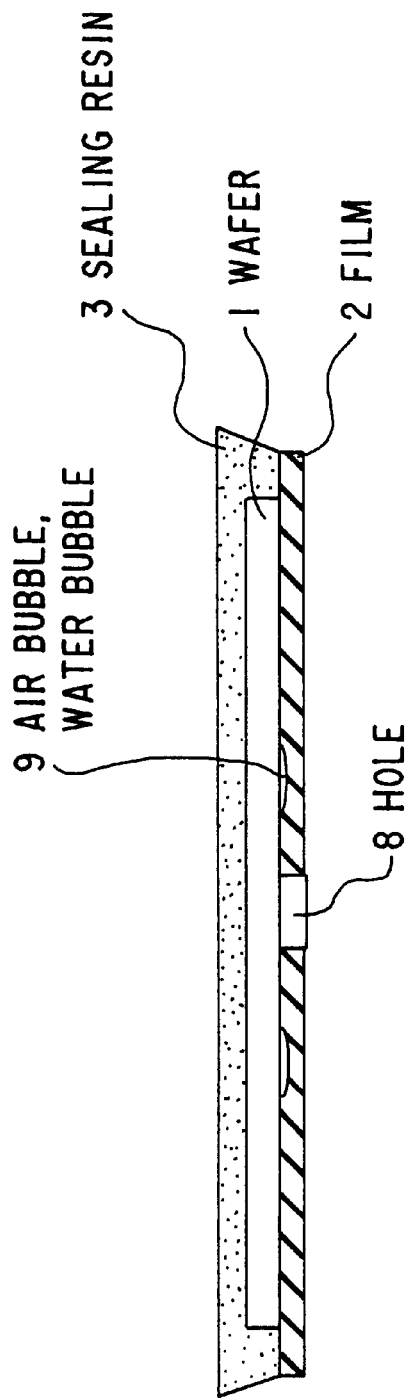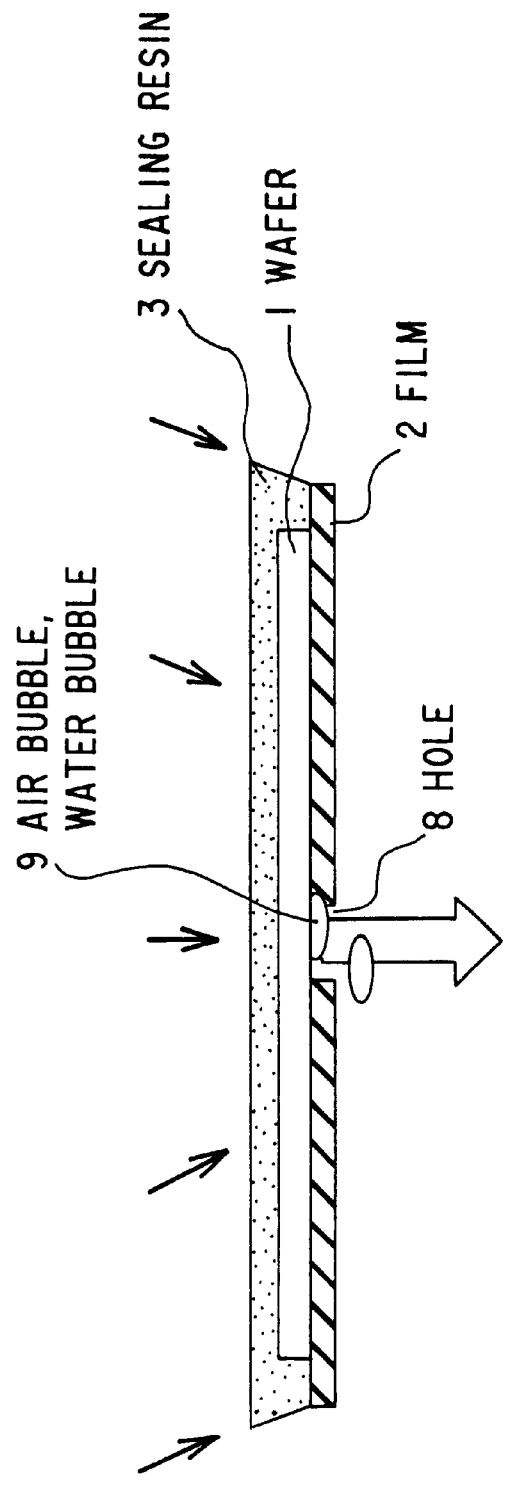
FIG. 8(a)
FIG. 8(b) DURING EVACUATION

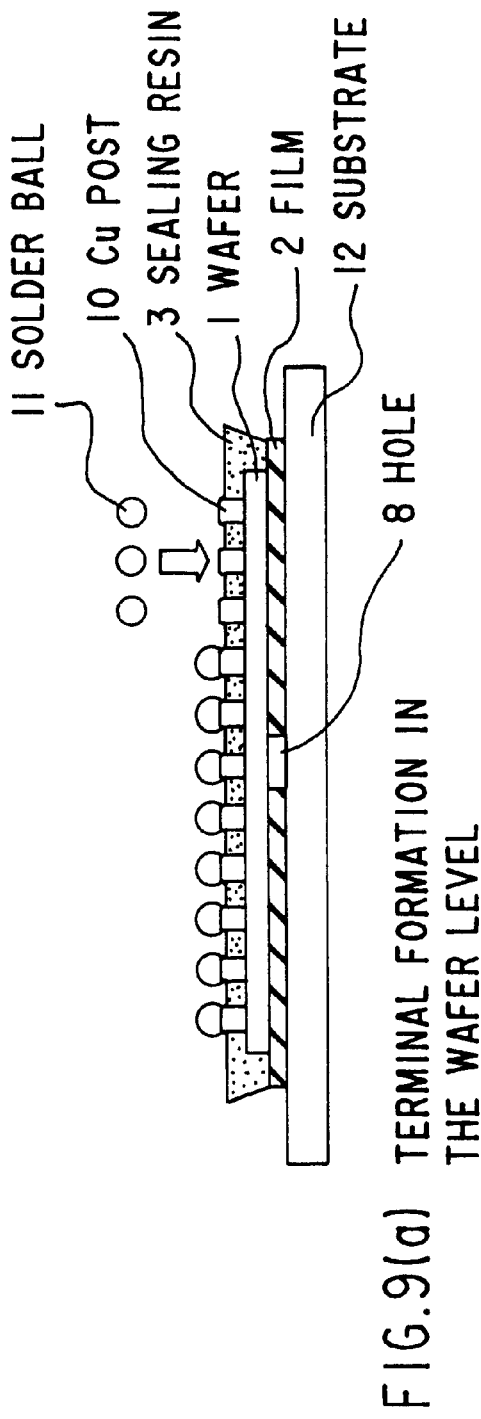
FIG.9(a) TERMINAL FORMATION IN THE WAFER LEVEL
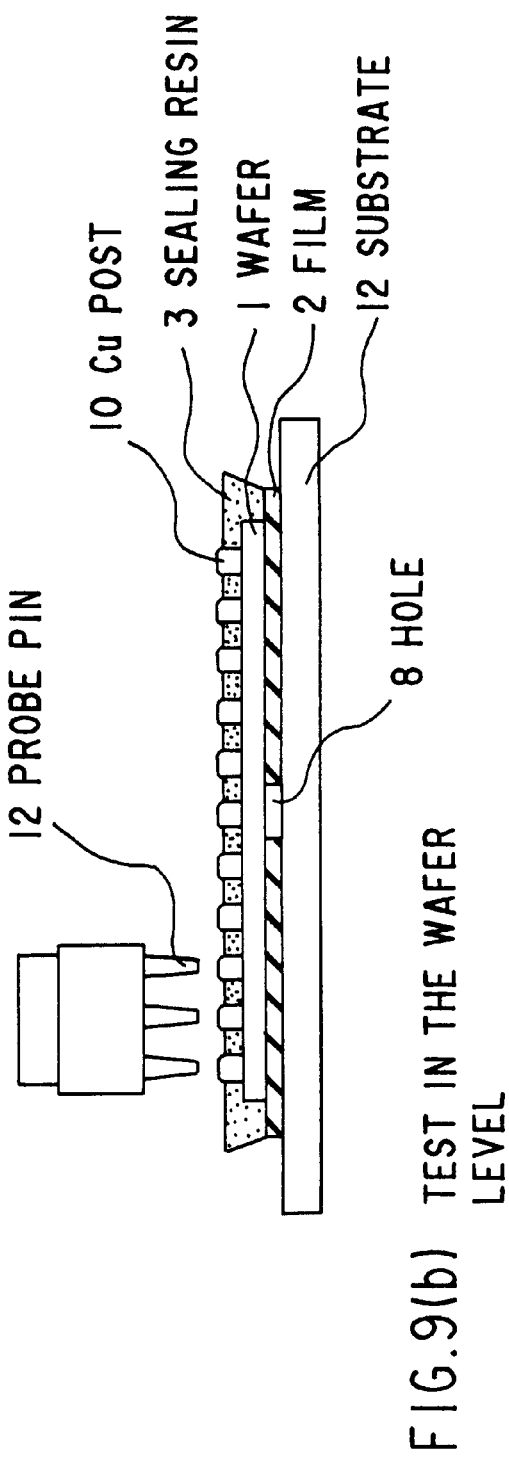
FIG.9(b) TEST IN THE WAFER LEVEL

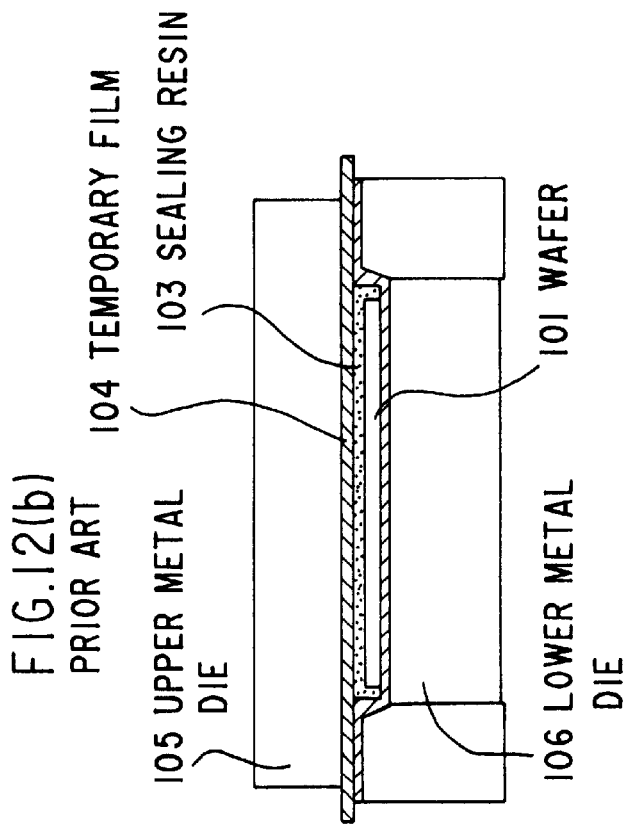
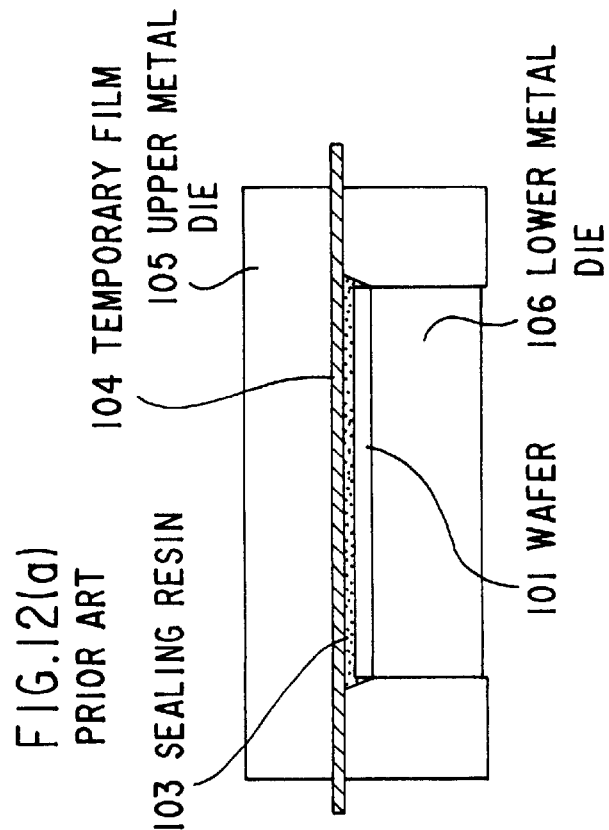
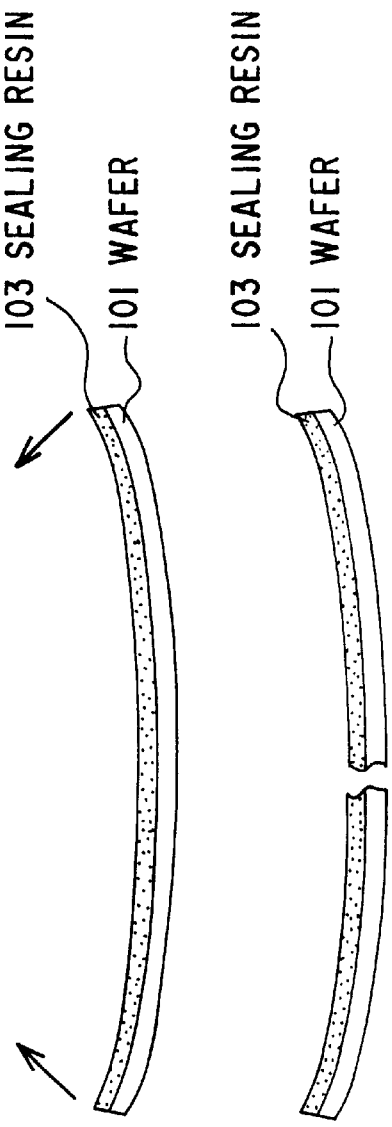

WAFER LEVEL SEMICONDUCTOR DEVICE AND METHOD OF MANUFACTURING THE SAME

BACKGROUND OF THE INVENTION

1. Field of the Invention

The present invention relates to a wafer level semiconductor device in which a plurality of chips and chip size packages (hereinafter referred to as CSP) are formed on a wafer, and a method of manufacturing the same.

2. Description of the Related Art

There has been proposed a semiconductor package in structure such that an external output terminal formed of a projected electrode is provided on a chip to shape a semiconductor device sealed by resin or the like as much as possible to a semiconductor element (hereinafter referred to as chip), at least a side surface of projected electrode is sealed by resin under the wafer condition and thereafter the wafer is cut to provide each chip. (Refer to the Japanese Published Unexamined Patent Application No. HEI 10-79362; U.S. patent application Ser. No. 09/029,608).

A wafer level semiconductor device is desirable to conduct various processes or test operations or the like under the wafer condition before the wafer is cut into separate chips.

FIGS. 12(a), 12(b) are diagrams illustrating an example of a method of manufacturing a wafer level semiconductor device of the related art.

FIGS. 12(a) and 12(b) are diagrams illustrating an example of a method of manufacturing a wafer level semiconductor device of the related art.

FIG. 12(b) illustrates a process for forming the sealing resin 103 also by further providing the temporary film 104 on the lower mold die 106, and shown in FIG. 12(a).

However, when the wafer 101 is taken out from the upper and lower mold dies after the resin sealing process, the wafer is cooled to room temperature. Therefore, a problem arises in that a stress indicated by the arrow mark is applied to the wafer 101, as illustrated in FIG. 12(c), due to a difference in thermal expansion coefficients of the wafer 101 and sealing resin 103, thereby warping the wafer 101.

The wafer level semiconductor device in this warped condition will result in another problem, when the next process is to be carried out, that the wafer cannot be placed horizontally on the vacuum-holding tray or the like. Moreover, if the wafer is handled forcibly, the wafer 101 will probably be broken, as illustrated in FIG. 12(d).

SUMMARY OF THE INVENTION

It is therefore an object of the present invention to provide a method of manufacturing a wafer level semiconductor device having a structure such that a sealing resin is formed on the wafer level semiconductor device and therefore the device is not warped even after it is taken out from the mold dies.

It is further object of the present invention to provide a method of processing the wafer level semiconductor device under the condition that the wafer is not warped.

The objects of the present invention are achieved by a wafer level semiconductor device comprising a wafer having a plurality of semiconductor elements formed on an upper surface thereof, a sealing resin including a first part for sealing the upper surface of the wafer and a second part for sealing a side surface of the wafer, the sealing resin having a lower edge surface flush with a lower surface of the wafer, and a film for covering the lower surface of the wafer and the lower edge surface of the second part of the sealing resin.

According to the wafer level semiconductor device described above, the entire part of the lower surface of the wafer and the lower edge surface of the second part of the sealing resin projected to the side surface of the wafer are covered with a film, and if a stress tending to warp the wafer is applied thereto, the film is placed in contact with the lower edge surface of the second part of the sealing resin and warpage of the wafer can therefore be prevented. A warping force is applied in the direction indicated by the arrow mark of FIG. 12(c), but because the film is holding the second part of the sealing resin, warpage of the wafer can be prevented.

Further objects of the present invention are achieved by the method of manufacturing the wafer level semiconductor device comprising the step of preparing the wafer level semiconductor device also comprising the wafer on which upper surface a plurality of semiconductor elements are formed, the sealing resin including the first part for sealing the upper surface of the wafer and the second part for sealing a side surface of the wafer. The sealing resin having a lower edge surface flush with a lower edge surface of the wafer, and a film for covering the lower surface of the wafer and the second part of the sealing resin, and the processing step for manufacturing the wafer level semiconductor device under the condition that the film is provided.

According to the method of manufacturing the wafer level semiconductor device described above, because the wafer is handled under the condition that the film is bonded on the lower surface of the wafer, various processes may be executed under the condition that the wafer is not warped.

According to the wafer level semiconductor device achieved such that the second part of the sealing resin hangs over from the wafer, the wafer level semiconductor device can easily be taken out from the mold dies even when the sealing resin does not include the release agent.

According to the wafer level semiconductor device of the present invention, a groove is provided at the dicing position at the upper surface of the wafer, and the resin is thickly formed at the cutting position as a result of the resin filling the groove. Because the mechanical strength of this part increases, a stress applied to the wafer at the time of dicing can be alleviated. Moreover, release of sealing resin from the wafer due to the stress applied at the time of dicing can also be prevented.

According to the wafer level semiconductor device of the present invention, a part of the external circumference of wafer is cut and the area of the second part of the sealing resin which becomes the bonding area of sealing resin for bonding the film increases, sufficient bonding area can be reserved without a widening of the diameter of the sealing resin.

According to the wafer level semiconductor device of the present invention, the film is bonded and fixed only to the second part of the sealing resin. Thus, the film can be bonded without increasing the cost of material or the number of processes.

According to the wafer level semiconductor device of the present invention, the film has a line expanding coefficient which is greater than that of the sealing resin, and warpage of the wafer toward the sealing resin can be prevented.

According to the wafer level semiconductor device of the present invention, the film is provided with a slit in parallel with the radius direction of the wafer, and the film and rear surface of the wafer, which are closely held, can be separated easily because such slit previously serves as the peeling allowance for the film.

According to the method of manufacturing the wafer level semiconductor device of the present invention, the film is provided with a hole to expose the rear surface of the wafer and the wafer level semiconductor device is processed while the wafer is vacuum-held via the vacuum-holding hole, the wafer and the film can simultaneously be fixed to the mold dies through vacuum-sticking of wafer when it is set on the mold die.

According to the method of manufacturing the wafer level semiconductor device of the present invention, the hole in the film is shaped to conform to the groove provided on the vacuum-holding surface of mold die for vacuum-holding the film, and the amount of film sucked in the groove at the vacuum-holding surface can be reduced.

BRIEF DESCRIPTION OF THE DRAWINGS

FIGS. 1(a) and 1(b) are diagrams for explaining a first embodiment of the present invention.

FIGS. 2(a) and 2(b) are diagrams illustrating a structure of mold dies used in the first embodiment.

FIGS. 4(a)–4(e) are diagrams for explaining a second embodiment of the present invention.

FIGS. 6(a)–6(d) are diagrams for explaining a fourth embodiment of the present invention.

FIGS. 8(a)–8(b) are diagrams for explaining an operation of the fourth embodiment.

FIGS. 9(a)–9(b) are diagrams for explaining a fifth embodiment of the present invention.

FIGS. 12(a)–12(d) are diagrams for explaining the prior art.

DESCRIPTION OF THE PREFERRED EMBODIMENTS

Figure 3A:
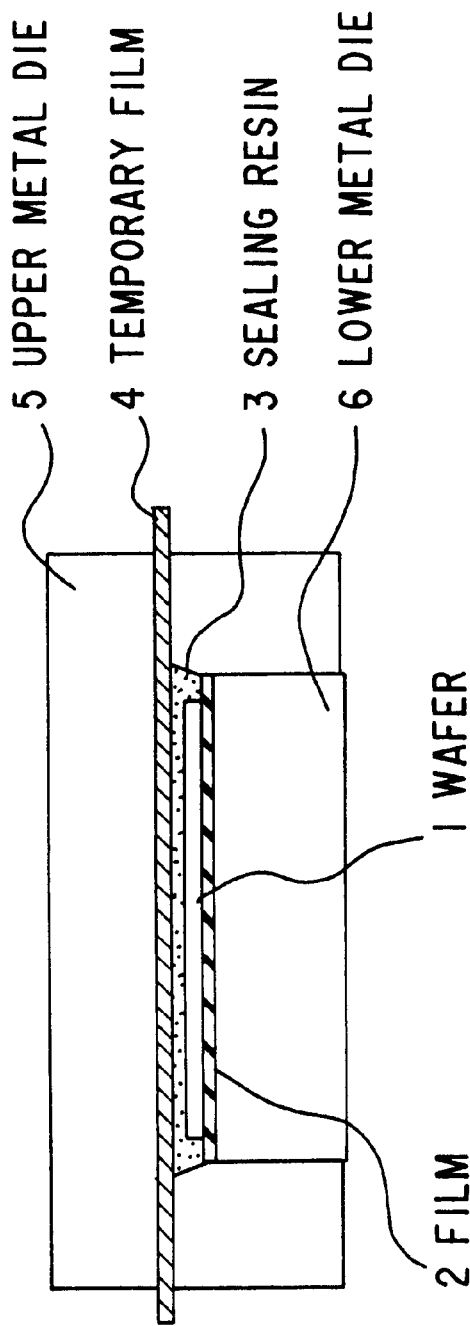
FIGS. 3(a) and 3(b) are diagrams for explaining a manufacturing method of the first embodiment of the present invention.

Reference will now be made in detail to the preferred embodiments of the present invention, examples of which are illustrated in the accompanying drawings, wherein like reference numerals refer to like elements throughout.

The preferred embodiments of the wafer level semiconductor device and method of manufacturing the wafer level semiconductor device of the present invention will be explained with reference to FIGS. 1–11.

In the wafer level semiconductor device of the present invention, an external output terminal formed of a projected electrode composed of Cu or the like is provided on each chip on the wafer and at least the side surface of the projected electrode is sealed by resin under the wafer condition. Moreover, in the wafer level semiconductor device of the present invention, a plurality of chips are formed on the upper surface thereof by the well known wafer process, but those in which a plurality of CSPs are formed on the substrate are sealed by the resin at a time are also included in the wafer level semiconductor device.

(First Embodiment)

Figure 3B:
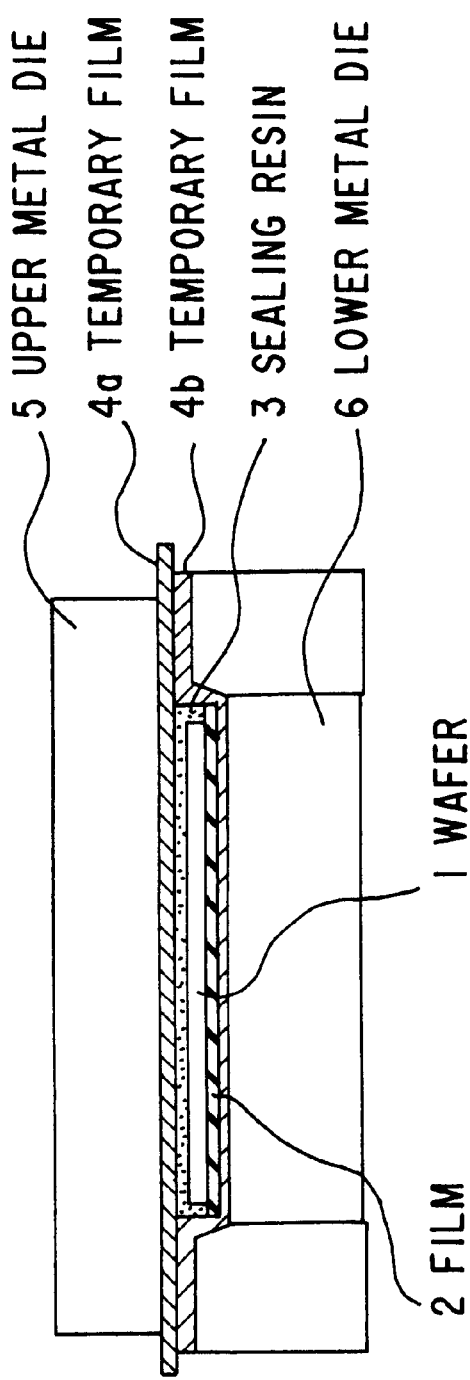

FIGS. 1–3 are diagrams for explaining the first embodiment of the present invention. FIG. 1(a) is a cross-sectional view of the wafer level semiconductor device; while FIG. 1(b), a bottom view of the wafer level semiconductor device seen from the side where the film is deposited in which the film itself is illustrated transparently. FIGS. 2(a), 2(b) illustrate structures of mold dies. FIGS. 3(a), 3(b) are diagrams illustrating a method of manufacturing the wafer level semiconductor device of the first embodiment.

In the above figures, the reference numeral 1 designates a semiconductor wafer in which a plurality of CSPs or ordinary chips are formed. On the chips or CPSs formed on the wafer 1, pad electrodes are formed and the connecting electrodes formed of copper are formed thereon (not shown). On the wafer 1, the sealing resin 3 is formed to protect the chips formed on the upper surface of wafer. The sealing resin 3 also seals the side surface of the wafer 1 at the area surrounded by the circle in FIG. 1(a). This part (hereinafter referred to as hang-over area 3a) has a lower edge surface flush with the lower surface of the wafer 1 and is formed integrally with the rest at the part sealing the surface of wafer 1.

Numeral 2 designates a film which is bonded to the hang-over area 3a of the sealing resin. As will be explained later, because the mold dies used for compressive formation are larger than the wafer size, the sealing resin is extended over the external diameter of the wafer at the time of molding. The extended hang-over area 3a works as the bonding area for the bonding between the film and sealing resin. Therefore, it is no longer required to coat the bonding agent on the film and the film can be bonded without increase of material cost and processes. This film is formed, for example, of a polyimide (line expansion coefficient: 20 to 50). When the line expansion coefficient is greater than that of the wafer (line expansion coefficient of silicon is 4), warpage of a wafer toward the sealing resin can be suppressed. Sufficient hang-over area 3a is selected, for example, to about 0.1 to 0.5 mm when the wafer diameter is 8 inches.

Particularly when the polyimide is used as the film 2, heat resistance and water-proof characteristics can be improved.

Moreover, since the hang-over area 3a is projected from the end part of film 2, the molded wafer can easily be taken out from the mold die even when the sealing resin not including the release agent is used. When the sealing resin is shaped straight so as to not include the hang-over area, the resin can also be taken out, although it becomes somewhat difficult to take out the resin.

The process of bonding the film 2 to the wafer level semiconductor device can be executed simultaneously with the process to form the sealing resin 3, as will be illustrated below.

FIG. 2 is a diagram explaining mold dies used in the process explained above. In both FIGS. 2(a) and 2(b), a space (cavity) formed by the upper mold die 5 and the lower mold die 6 is larger than the wafer 1 and the wafer 1 is placed on the lower mold die 6. The film at the rear surface of the wafer is neglected. When the resin is compressed between the upper mold die 5 and lower mold die 6, the sealing resin 3 can be formed on the wafer level semiconductor device. In this case, a temporary film is provided to the mold dies so that the resin can easily separated from the mold dies at the time of taking it out therefrom.

FIG. 2(a) illustrates the case that the temporary film 4 is provided only to the upper mold die, while FIG. 2(b), the case that the temporary film 4a is provided to the upper mold die 5 and the temporary film 4b is provided to the lower mold die 6.

FIG. 3 illustrates the processes to form the sealing resin 3 through compressive forming of resin to the wafer set on the mold die of FIG. 2. FIGS. 3(a), 3(b) respectively correspond to FIGS. 2(a), 2(b).

The wafer 1 is set on the lower mold die 6 via the film 2. The diameter of film 2 is set to a value in which the resin part extended from the wafer 1 (hang-over area 3a) is added to the diameter of wafer.

The sealing resin 3 can be formed by placing a resin tablet (not illustrated) at the center of the wafer, applying pressure to the upper and lower mold dies and heating these dies simultaneously, where the resin tablet is expanded on the wafer 1 and it is the compressed. Thereby, the sealing resin 3 is formed to cover the upper and side surfaces of the wafer 1.

At the time of this molding, the hang-over area 3a is formed by the sealing resin extending from the external circumference of the wafer and the film is then bonded to this hang-over area 3a.

Thereafter, the wafer 1 is taken out from the mold dies under the condition that the film is bonded to the rear surface thereof. When the temperature is reduced to room temperature, a stress illustrated in FIG. 12(c) is applied to the wafer. In this case, because the film bonded to the hang-over area 3a of the wafer pulls the wafer in the direction opposite the stress, warpage of the wafer can be prevented.

FIG. 4 is a diagram for explaining a second embodiment of the present invention.

At the time of a dicing process to cut a plurality of chips formed on the wafer to individual pieces, a large force is applied to the wafer. This embodiment is intended to alleviate such force.

FIG. 4(a) is a plan view of the wafer illustrating that precut groove 7 is provided at the dicing position on the wafer. At the rear surface of the wafer, the film 2 illustrated in FIG. 1 is provided. In the groove 7, the cross-section of the groove is rectangular or triangular in shape, as illustrated in FIGS. 4(b), 4(c).

When dicing is performed, for example, a depth of up to about ⅕ the thickness of he wafer is sufficient.

After formation of the precut groove 7, the sealing resins and film 2 are formed on the wafer 1 by the process explained in regard to FIG. 3. In this case, the sealing resin 3 is formed to fill the precut groove 7, as illustrated in FIGS. 4(d), 4(e).

At the time of dicing, the chips are cut into individual pieces by the dicer at the cutting positions 7c. In this case, because the resin is formed to be thicker at the cutting position than the resin filling the precut groove 7, the mechanical strength of the resin at this cutting position increases and therefore the stress applied to the wafer at the time of dicing may be alleviated. Moreover, separation of the sealing resin 3 from the wafer 1 due to the stress generated at the time of dicing is prevented.

Figure 5C:
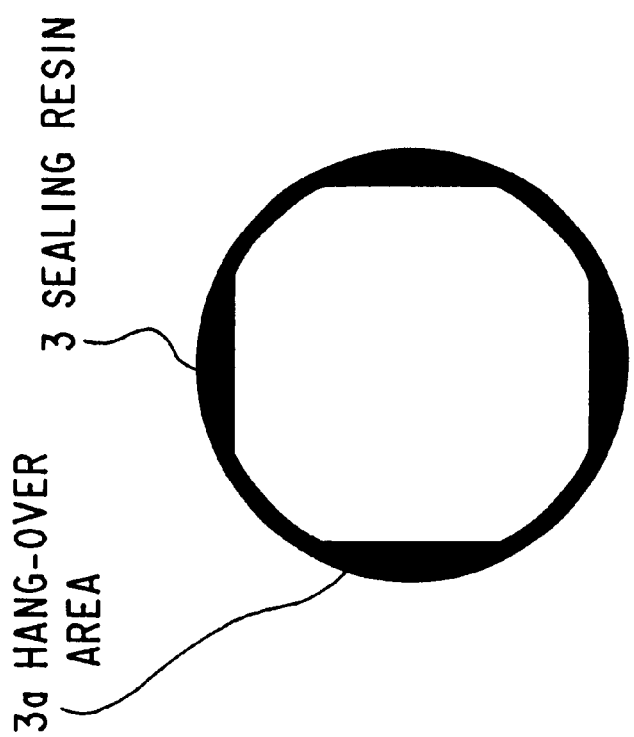
FIGS. 5(a)–5(c) are diagrams for explaining a third embodiment of the present invention.
Figure 5B:
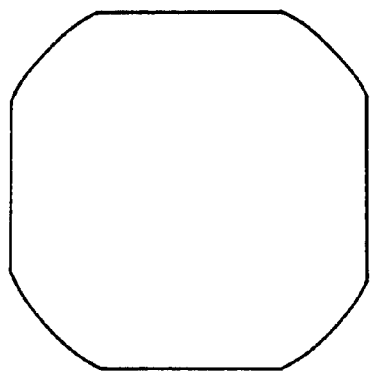
Figure 5A:
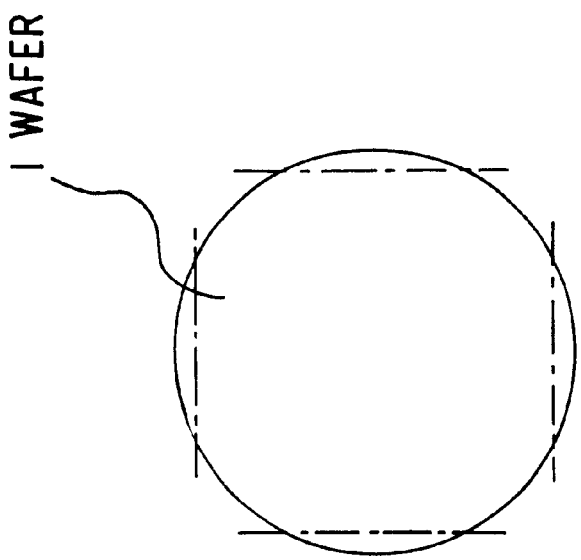

FIG. 5(a) is a plan view of the wafer 1. The dotted line indicates the cutting positions of wafer. FIG. 5(b) is a plan view indicating the condition after a part of the external circumference of wafer 1 is cut along the dotted line of FIG. 5(a). FIG. 5(c) is a bottom view of the wafer in the condition after the wafer illustrated in FIG. 5(b) is compressed by the process illustrated in FIG. 3. Here, the film is illustrated transparently in order to clearly illustrate the hang-over area 3a of the resin.

Because the area of the hang-over area 3a which becomes the bonding area of the sealing resin for bonding the film is increased by cutting a part of the external circumference of the wafer, sufficient bonding area can be reserved without extending the diameter of the resin part. Moreover, the external circumference cutting process can be realized in the same process as the precut groove forming process when such process is executed in the process to form the precut groove illustrated in FIG. 4.

FIGS. 6(a) to (d) are diagrams for explaining the fourth embodiment of the present invention. FIG. 6(a) is a cross-sectional view of the wafer. FIG. 6(b) is a plan view of the film and FIGS. 6(c) and 6(d) are diagrams illustrating the process t the sealing resin by setting the wafer on the mold die.

This embodiment is intended to improve the handling procedure to set the wafer on the mold die.

FIG. 6(a) is a cross-sectional view of the condition that the film 2 illustrated in FIG. 6(b) is bonded to the lower surface of the wafer 1. The film 2 is provided with a through-hole 8 at the center thereof. The hole 8 of the film 2 exposes the lower surface of the wafer 1.

When the wafer 1 is set on the lower mold die 6, the wafer 1 and film 2 can be simultaneously fixed on the lower mold die 6 by vacuum-holding in the direction indicated by the arrow marks of FIGS. 6(c) and 6(d) (a vacuum-holding means is not illustrated).

Figure 7C:
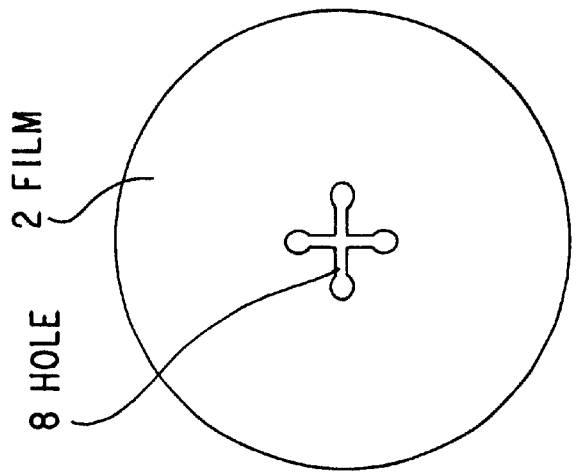
FIGS. 7(a)–7(c) are diagrams for explaining the fourth embodiment of the present invention.
Figure 7B:
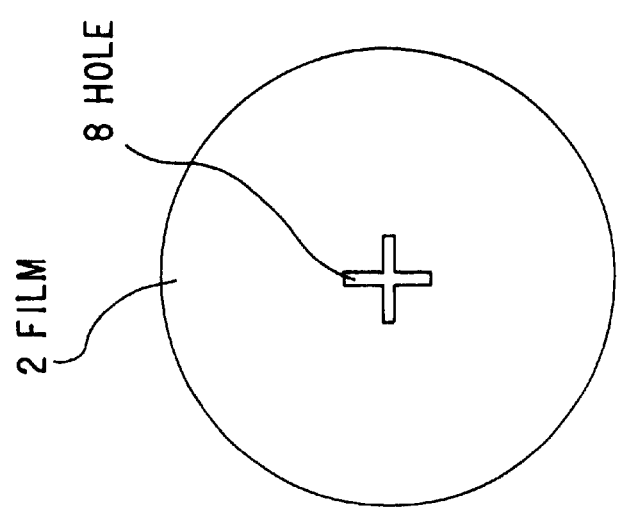
Figure 7A:
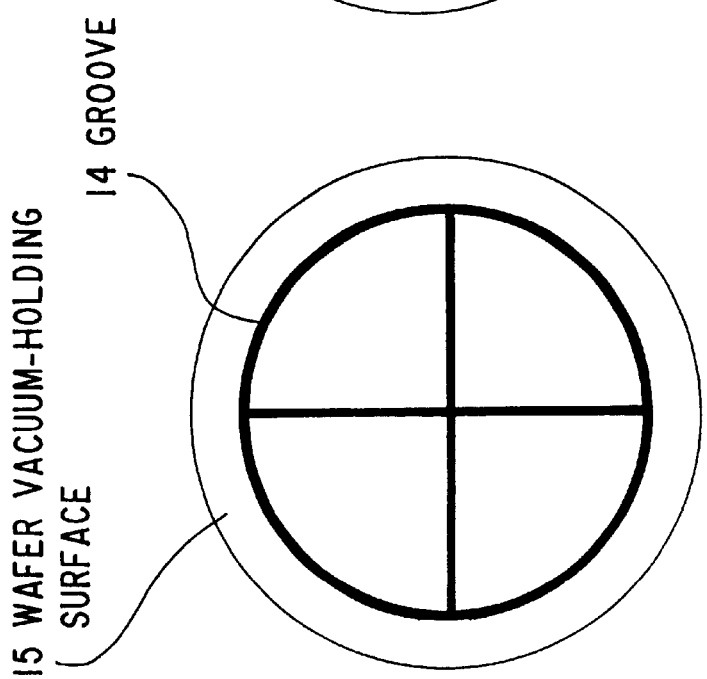

FIGS. 7(a) to (c) are diagrams for explaining modification examples of the hole provided on the film 2. FIG. 7(a) illustrates the lower mold die working as the film vacuum-holding surface. FIGS. 7(b) and 7(c) illustrate a plan view of the film 2. The lower mold die having the waver vacuum-holding surface 15 is provided with a vacuum-holding groove 14, as illustrated in FIG. 7(a). In this example, the circular groove 14, which is smaller than the external diameter of the wafer and the groove in the shape of a cross are provided. These grooves are provided with a mechanism for evacuating the inside of grooves using an evacuation device (not illustrated).

FIG. 7(b) illustrates the condition that a cross shape hole 8 corresponding to this groove is provided on the film 2. FIG. 7(c) prevents that the film is broken from the edge part of hole by processing the edge part of cross shape hole to the circular shape.

Usually, when the film 2 and wafer 1 are vacuum-held, the film 1 is sucked toward the groove at the vacuum-holding surface. Therefore, when the film is bonded through a compressive forming process, it may be loosened. Therefore, the amount of sucking of film into the groove 14 can be reduced to prevent such loosening by processing the hole 8 to have a shape conforming to the groove 14, as illustrated in FIG. 7.

Moreover, even if air bubbles or water bubbles are generated between the film 2 and wafer 1, such bubbles may be removed, as illustrated in FIG. 8(b), through the hole 8 at the time of evacuation, by providing the hole 8 as illustrated in FIG. 8(a). Thereby, expansion and peeling of film resulting from such bubbles can be prevented. Only one hole is provided in the figure, but a plurality of holes may also be provided.

The wafer level semiconductor device of the present invention is manufactured in the structure illustrated in FIGS. 9(a) and 9(b) that the Cu posts connected to the electrode on the chip are exposed from the sealing resin 3. Various processes to these Cu posts will then be explained below.

FIG. 9(a) illustrates a process to provide solder balls 11 at the end points of the Cu posts 10. The solder balls may be provided one by one or at a time in every chip. The solder balls can provided on the Cu posts by coating the flux on the Cu posts, thereafter loading the solder balls 11 thereon and then heating the flux up to the predetermined temperature.

During this process, the wafer level semiconductor device is fixed by the vacuum-holding process or the like via the hole 8 on the substrate 12. In this case, the device can be fixed on the substrate 12 under the warp-free condition as a result of the operation of film 2 and the solder ball loading process can be done smoothly.

FIG. 9(b) illustrates a process to test the chip through contact of probe pin 12 to the Cu post 10. In this case, the probe pin 12 may be placed in contact in units of several pins or all pins may be placed in contact simultaneously.

During this test process, the wafer level semiconductor device by the vacuum-holding or the like via the hole 8 on the substrate 12 and it is fixed on the substrate 12 under the warp-free condition as a result of the film 2 and therefore the test process can be done smoothly.

As an example of the process to manufacture the wafer level semiconductor device of the present invention, the precut groove forming process, solder ball loading process and test process have been explained above. Moreover, the other processes can also be conducted smoothly under the warp-free condition as a result of operation of the film.

Figure 10B:
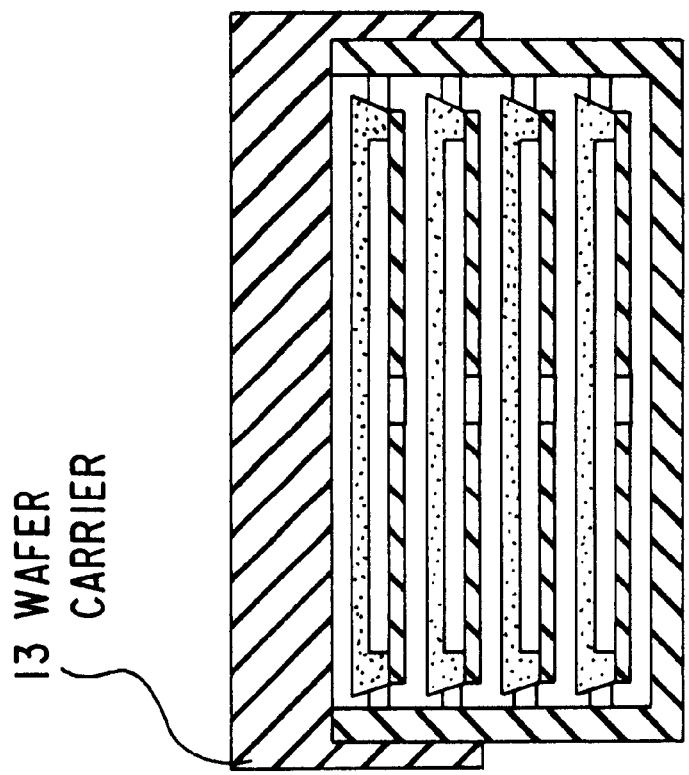
FIGS. 10(a)–10(b) are diagrams for explaining a sixth embodiment of the present invention.
Figure 10A:
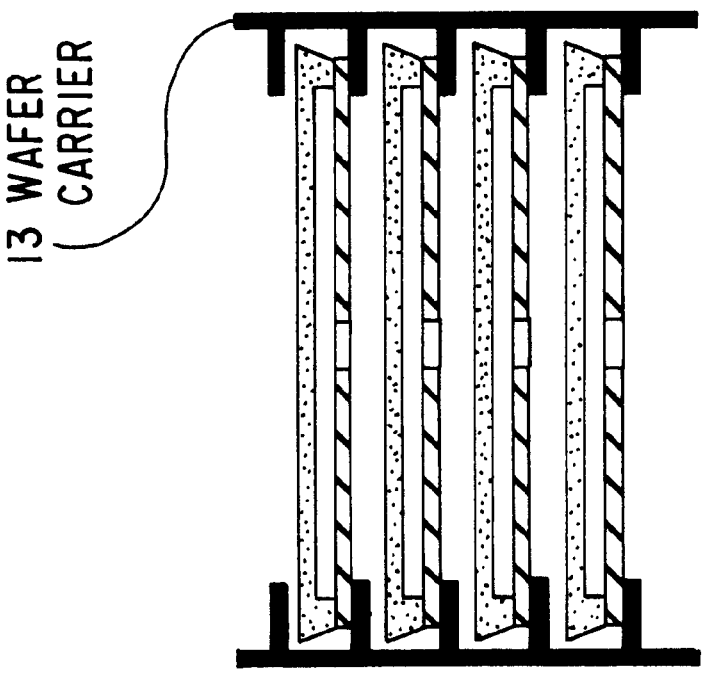

FIGS. 10(a) and (b) are diagrams for explaining the sixth embodiment of the present invention. FIGS. 10(a) and 10(b) respectively illustrate that the wafer level semiconductor devices of the present invention are accommodated in wafer carriers of different types.

Since the wafer is never warped due to the operation of film, it can be accommodated in direct to the wafer carrier 13 and thereby it can also be delivered under this condition.

Figure 11C:
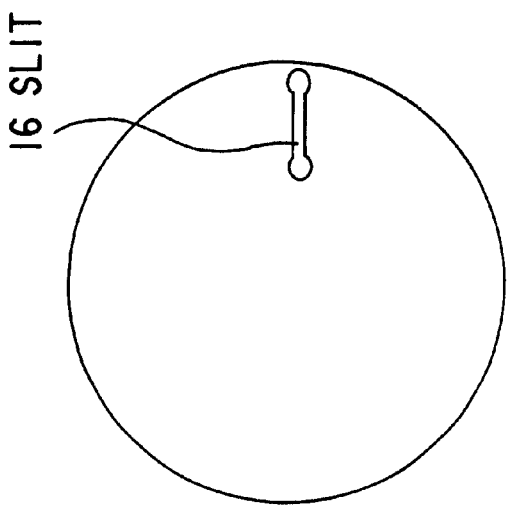
FIGS. 11(a)–11(c) are diagrams for explaining a seventh embodiment of the present invention.
Figure 11B:
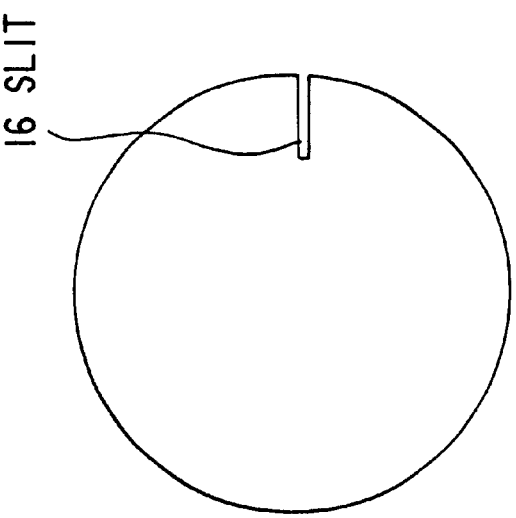
Figure 11A:
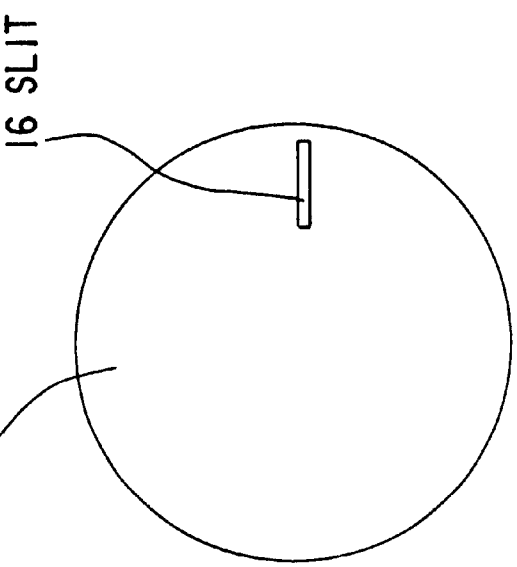

FIGS. 11(a), (b), (c) are diagrams for explaining the seventh embodiment of the present invention. FIGS. 11(a), 11(b and 11(c) are plan views of film 2 on which the slits 16 of different shapes are provided. In this embodiment, it is intended to easily peel the unwanted film 2.

FIG. 11(a) illustrates a condition that the slit 16 does not reach the end part of film 2. FIG. 11(b) illustrates a condition that the slit 16 reaches the end part of wafer 1, while FIG. 11(c) a condition that the edge part of slit 16 has a circular shape.

Because the edge part has the circular shape, the film is prevented from being broken from the edge part.

Usually, in the dicing process, a UV tape is bonded to the entire part of rear surface of wafer in order to hold the chips and thereby the chips divided into individual chip pieces by the dicing process are no longer separated. However, because the film 2 is bonded to the lower surface of the wafer only with the hang-over area 3a, there arises a problem that the chips are separated if the dicing is conducted under the condition that the film 2 is bonded. To prevent such an event, the film 2 is peeled before the dicing process and the UV tape is in turn bonded.

At the time of peeling the film 2, the blade of a cutter, for example, is inserted between the film and resin hang-over area 3a and it is then turned along the circumference. However, the film and lower surface of wafer are closed held and the external circumference and resin hang-over area 3a are also closely held not to provide any peeling allowance. Therefore, such peeling work can be done easily by previously providing a slit 16 which will works as the peeling allowance to the film, as illustrated in FIGS. 11(a), 11(b) and 11(c).

As explained above, the wafer level semiconductor device and the method of manufacturing the same semiconductor device of the present invention provide an effect that because the entire lower surface of the wafer and the second part of the sealing resin having a lower edge surface flush with the lower surface of the wafer hanging over the side surface of wafer are covered with a film, if a force is applied thereto to warp the wafer, warpage of the wafer can be prevented because the film is bonded to the lower edge surface of the second part of the sealing resin.

Moreover, because the wafer is treated under the condition that the film is bonded to the lower surface of the wafer, various processes can be performed under the warp-free condition of wafer.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A wafer level semiconductor device, comprising:
   a wafer having a plurality of semiconductor chips formed on an upper surface thereof;
   a sealing resin including a first part for sealing the upper surface of the wafer and a second part for sealing a side surface of the wafer, the second part having a lower edge surface flush with a lower surface of the wafer; and
   a film for covering a lower surface of the wafer and the lower edge surface of the second part of the sealing resin,
   wherein the film is fixed only to the lower edge surface of the second part of the sealing resin, and
   wherein the film pulls said wafer in a direction opposite a direction of stress produced during formation of said chips to prevent warpage of the wafer.

2. A wafer level semiconductor device as claimed in claim 1, wherein the second part of said sealing resin hangs over the wafer.

3. A wafer level semiconductor device as claimed in claim 1, wherein a groove is provided at a dicing position on the surface of the wafer.

4. A wafer level semiconductor device as claimed in claim 1, wherein a part of the external circumference of the wafer is cut.

5. A wafer level semiconductor device as claimed in claim 1, wherein the film is fixed only to the second part of the sealing resin by bonding.

6. A wafer level semiconductor device as claimed in claim 1, wherein the film has a line expansion coefficient which is greater than that of the sealing resin.

7. A wafer level semiconductor device as claimed in claim 1, wherein the film is provided with a slit in parallel with the radius direction of the wafer.

8. A method of manufacturing a wafer level semiconductor device, comprising the steps of:
   preparing a wafer level semiconductor device including a wafer having a plurality of chips formed on an upper surface thereof, a sealing resin including a first part for sealing the upper surface of the wafer and a second part for sealing a side surface of the wafer, the second part having a lower edge surface flush with a lower surface of the wafer, and
   providing a film to the lower surface of the wafer and the lower edge of the sealing resin,
   wherein the film is fixed only to the lower edge of the second part of the sealing resin, and
   wherein the film pulls said wafer in a direction opposite a direction of stress produced during formation of said chips to prevent warpage of the wafer.

9. A method of manufacturing a wafer level semiconductor device as claimed in claim 8, comprising an additional step of providing a hole in the film to expose the rear surface of the wafer to the film and manufacturing the wafer level semiconductor device through vacuum-holding of the wafer via the hole.

10. A method of manufacturing a wafer level semiconductor device as claimed in claim 9, wherein the hole in the film has a shape conforming to a groove provided at the vacuum-holding surface of a mold die for vacuum-holding the film.

11. The method of manufacturing a wafer level semiconductor device as claimed in claim 8, wherein the film is only fixed to the sealing resin by bonding.

* * * * *

UNITED STATES PATENT AND TRADEMARK OFFICE
CERTIFICATE OF CORRECTION

PATENT NO.    : 6,515,347 B1
DATED         : February 4, 2003
INVENTOR(S)   : Shinma et al.

It is certified that error appears in the above-identified patent and that said Letters Patent is hereby corrected as shown below:

<u>Title page,</u>
Item [75], delete "Kawashara" and insert -- Kawahara --.

Signed and Sealed this

Sixth Day of April, 2004

JON W. DUDAS
*Acting Director of the United States Patent and Trademark Office*